United States Patent
Matsubara et al.

(10) Patent No.: US 8,174,901 B2
(45) Date of Patent: May 8, 2012

(54) SEMICONDUCTOR INTEGRATED CIRCUIT DEVICE

(75) Inventors: Ken Matsubara, Tokyo (JP); Hideo Kasai, Tokyo (JP); Kenji Kawada, Tokyo (JP); Makoto Mizuno, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 239 days.

(21) Appl. No.: 12/721,553

(22) Filed: Mar. 10, 2010

(65) Prior Publication Data
US 2010/0232232 A1 Sep. 16, 2010

(30) Foreign Application Priority Data
Mar. 12, 2009 (JP) ................................. 2009-058894

(51) Int. Cl.
*G11C 11/34* (2006.01)
(52) U.S. Cl. ............... 365/185.23; 365/189.23; 365/148
(58) Field of Classification Search ............. 365/189.05, 365/148, 226, 163, 230.08, 189.16, 185.18, 365/51, 63, 205, 228, 189.04
See application file for complete search history.

(56) References Cited

U.S. PATENT DOCUMENTS

| | | | |
|---|---|---|---|
| 6,504,748 B2 | 1/2003 | Choi et al. | |
| 6,507,510 B2 | 1/2003 | Takashima | |
| 6,947,309 B2 | 9/2005 | Watanabe et al. | |
| 2006/0028853 A1* | 2/2006 | Osada et al. | 365/63 |
| 2011/0147469 A1* | 6/2011 | Ma et al. | 235/492 |

FOREIGN PATENT DOCUMENTS

| | | |
|---|---|---|
| JP | 2002-025247 A | 1/2002 |
| JP | 2002-184171 A | 6/2002 |
| JP | 2004-318978 A | 11/2004 |

* cited by examiner

*Primary Examiner* — Dang Nguyen
(74) *Attorney, Agent, or Firm* — Miles & Stockbridge P.C.

(57) ABSTRACT

This invention is to reduce the number of memory gate drivers, while lessening the number of times of disturb occurrence in a memory array configuration that implements writing in small byte units. A memory array comprises a plurality of sub-arrays, MG transfers, SL drivers, and CG drivers. Each sub-array includes a plurality of memory gate lines, control gate lines, source lines, and bit lines. Memory cells are arranged in positions of intersections of these lines. The control gate lines, CG drivers, source lines, and SL drivers are common to the sub-arrays, whereas the memory gate lines and MG buffer circuits are provided for each sub-array. Thereby, the units in which data is written are decreased and adverse effects of disturb are reduced without increasing the circuit size of the memory array.

18 Claims, 15 Drawing Sheets

| | BL | CGL | MGL | SL |
|---|---|---|---|---|
| READ | 1.5V | 1.5V | 0V | 0V |
| WRITE | 0V *1.5V | 1.0V *0.0V | 10V *3.5V | 5V *1.5V |
| ERASE | 1.5V | 0.0V | -10V | 5V |

* VOLTAGE THAT IS APPLIED TO DESELECTED CELL

FIG. 12

| | | MG LENGTH (A) | MINIMUM UNIT OF WRITING (B) | UNIT OF ERASING | NUMBER OF TIMES OF Disturb-A OCCURRENCE (A/B) | NUMBER OF MG DRIVERS (*1) | CG DRIVERS | NUMBER OF TIMES OF PE |
|---|---|---|---|---|---|---|---|---|
| MEMORY ARRAY NOT DIVIDED, MG DRIVER/CG DRIVER SHARED | | 128Byte (1024bit) | 8Byte (64bit) | 8KByte | 16 times | 16 (*2) | 128 | 30K |
| DISTURB LESSENING SCHEMES | DISTRIBUTING MG DRIVERS | 128Byte (1024bit) | 1Byte (8bit) | 128Byte | 128 times | 128 | 128 | 100K |
| | DISTRIBUTING MG DRIVERS & CG DRIVERS | 16Byte (128bit) | | | 16 times | 1024 | 1024 | |
| | HIERARCHIZATION OF MG DRIVERS + SHARING OF CG DRIVERS | | | | | 128+16 | 512 | |

(*1) Calculated assuming that the capacity of the memory module is 16 KB

SEMICONDUCTOR INTEGRATED CIRCUIT DEVICE

CROSS-REFERENCE TO RELATED APPLICATIONS

The disclosure of Japanese Patent Application No. 2009-58894 filed on Mar. 12, 2009 including the specification, drawings and abstract is incorporated herein by reference in its entirety.

BACKGROUND OF THE INVENTION

The present invention relates to a technique for improving the reliability of a nonvolatile memory module and, particularly, to a technique that is effective for preventing data corruption due to disturb encountered in writing in small byte units.

In recent years, for semiconductor integrated circuit devices such as microcomputers incorporating a nonvolatile memory and microcomputers of a so-called flash memory built-in type, there is a need to mount a flash memory module that supports writing in small byte units.

FIG. 18 is an illustrative diagram showing a configuration example of a memory array 100 provided in a flash memory module examined by the present inventors.

In the memory array 100, as shown, SL driver circuits 101, MG drivers 102, and CG drivers 103 are provided. In order to decrease the areas of the drivers providing control signals, the memory array 100 is configured to have an array of memory cells MCs arranged in positions where signal lines (memory gate lines MGLs, control gate lines CGLs, source lines SLs) for selecting a memory cell MC intersect with signal lines (bit lines BLs) for transferring data that is input to or output from a memory cell MC.

In the above array configuration, a plurality of memory cells MCs coupled to one control gate line CGL share a memory gate line MGL and a source line SL. Therefore, for example, while the memory gate line MGL and the source line SL are selected, there are memory cells whose bit lines are deselected.

In this case, a hatched memory cell MC is selected, whereas memory cells MCs surrounded by bold lines are deselected. These deselected memory cells are placed in a write deselect state, but carry a weak write current, which may give rise to an unintended variation of a threshold voltage Vth (hereinafter referred to as disturb).

A technique as a countermeasure against such disturb is known, whereby a memory array is configured, for example, such that the number of memory cells MCs coupled to one memory gate line (MGL) is limited.

SUMMARY OF THE INVENTION

However, the inventors found that the above-mentioned technique as a countermeasure against the disturb experienced by a nonvolatile memory has problems discussed below.

For example, a minimum unit of writing for a flash memory module having the memory array configuration shown in FIG. 18, outlined above, is 64 bits (8 bytes). Assuming a total of 1024 bits (128 bytes) for the cells coupled to one memory gate line, a write deselect state (disturb) where a bit line is deselected, while the memory gate line and the source line are selected, may occur 16 times, 1024 bits/64 bits=16.

Because a common memory gate driver for a plurality of memory gate lines is provided to drive and select the memory gate lines, the number of memory cells whose memory gate line is selected (their memory gate line is selected, but their source line is deselected) becomes larger than the number of memory cells whose memory gate line and source gate line are selected, but whose bit line is deselected, as mentioned above.

Here, as is shown in FIG. 19, in a case where a memory gate driver is provided for each memory gate line, the minimum unit of writing can be decreased to, for example, 8 bits (1 byte). But, the disturb state occurrence increases to 128 times, 1024 bits/8 bits=128. Moreover, the number of memory gate drivers multiplies.

Then, in order to reduce the number of memory cells MCs coupled to one memory gate line MGL, for example, for decreasing from 1024 bits to 128 bits, a possible solution is such that the memory array 100 is altered to an array configuration comprised of a plurality of sub-arrays 104, as is shown in FIG. 20. Thereby, the number of memory cells MCs to be selected by one MG driver 102 is reduced and the number of times of disturb occurrence can be reduced to 16 times, 128 bits/8 bits=16, which is the same level as before.

However, a problem arises that the number of memory gate drivers is further multiplied more than that in the case of the array configuration shown in FIG. 19, because it is necessary to provide memory gate drivers for each sub-array 104.

An object of the present invention is to provide a technique that makes it possible to reduce the number of memory gate drivers, while lessening the number of times of disturb occurrence in a memory array configuration that implements writing in small byte units.

The above-noted and other objects and novel features of the present invention will become apparent from the following description in the present specification and the accompanying drawings.

Typical aspects of the invention disclosed herein are outlined as follows.

One aspect of the present invention resides in a semiconductor integrated circuit device comprising: a plurality of nonvolatile memory cells, each including a read select gate terminal, a write gate terminal, a data input/output terminal, and a power supply terminal; a plurality of sub-arrays, each including read gate lines to which the write gate terminals of the nonvolatile memory cells are commonly coupled, read gate line driving circuits which drive the read gate lines, read select gate lines to which the read select gate terminals of the nonvolatile memory cells are commonly coupled, power supply lines to which the power supply terminals of the nonvolatile memory cells are commonly coupled, and data lines each of which is coupled to the data input/output terminals; a memory array including the sub-arrays, write gate line driving circuits which are provided in common to the read select gate lines included in each of the sub-arrays, power supply line driving circuits which are commonly coupled to the power supply terminals included in each of the sub-arrays, and read gate line transfer circuits which are commonly coupled to the read gate line driving circuits; a write data transfer circuit whose components are coupled respectively to the data lines included in the sub-arrays and transfers data to be written into at least one of the nonvolatile memory cells when writing data into the nonvolatile memory cells; a data line selecting circuit whose components are coupled respectively to the data lines included in the sub-arrays and selects a data line when reading data from at least one of the nonvolatile memory cells; and an amplifier circuit which is commonly coupled to the components of the data line select circuit and amplifies a data signal appearing on the data line selected by the data line selecting circuit.

Another aspect of the present invention resides in a semiconductor integrated circuit device comprising: an input/output circuit which inputs and outputs data and instructions; a bus which is coupled to the input/output circuit and serves as a path for transmitting the data and instructions; an operational circuit which is coupled to the bus, receives the data and instructions, and performs operational processing for the data; and a memory module which is coupled to the operational circuit and stores a result of operational processing performed by the operational circuit and instructions to be used by the operational circuit. The memory module includes: a plurality of nonvolatile memory cells, each including a read select gate terminal, a write gate terminal, a data input/output terminal, and a power supply terminal; a plurality of sub-arrays, each including: read gate lines to which the write gate terminals of the nonvolatile memory cells are commonly coupled; read gate line driving circuits which drive the read gate lines; read select gate lines to which the read select gate terminals of the nonvolatile memory cells are commonly coupled; power supply lines to which the power supply terminals of the nonvolatile memory cells are commonly coupled; and data lines each of which is coupled to a subset of the data input/output terminals; a memory array including the sub-arrays, write gate line driving circuits which are provided in common to the read select gate lines included in each of the sub-arrays, power supply line driving circuits which are commonly coupled to the power supply terminals included in each of the sub-arrays, and read gate line transfer circuits which are commonly coupled to the read gate line driving circuits; a write data transfer circuit whose components are coupled respectively to the data lines included in the sub-arrays and transfers data to be written into at least one of the nonvolatile memory cells when writing data into the nonvolatile memory cells; a data line selecting circuit whose components are coupled respectively to the data lines included in the sub-arrays and selects a data line when reading data from at least one of the nonvolatile memory cells; and an amplifier circuit which is commonly coupled to the components of the data line select circuit and amplifies a data signal appearing on the data line selected by the data line selecting circuit.

A further aspect of the present invention resides in a semiconductor integrated circuit device comprising: a plurality of nonvolatile memory cells, each including a read select gate terminal, a write gate terminal, a data input/output terminal, and a power supply terminal; a plurality of sub-arrays, each including read gate lines to which the write gate terminals of the nonvolatile memory cells are commonly coupled, read gate line driving circuits which drive the read gate lines, read select gate lines to which the read select gate terminals of the nonvolatile memory cells are commonly coupled, power supply lines to which the power supply terminals of the nonvolatile memory cells are commonly coupled, and data lines each of which is coupled to the data input/output terminals; a memory array including the sub-arrays, write gate line driving circuits which are provided in common to the read select gate lines included in each of the sub-arrays, power supply line driving circuits which are commonly coupled to the power supply terminals included in each of the sub-arrays, and read gate line transfer circuits which are commonly coupled to the read gate line driving circuits; a write data transfer circuit whose components are coupled respectively to the data lines included in the sub-arrays and transfers data to be written into at least one of the nonvolatile memory cells when writing data into the nonvolatile memory cells; a data line selecting circuit whose components are coupled respectively to the data lines included in the sub-arrays and selects a data line when reading data from at least one of the nonvolatile memory cells; and an amplifier circuit which is commonly coupled to the components of the data line select circuit and amplifies a data signal appearing on the data line selected by the data line selecting circuit. The nonvolatile memory cells comprise complementary storage cells in which one unit of data is stored in a pair of a negative cell for storing negative data and a positive cell for storing positive data.

Still another aspect of the present invention resides in a semiconductor integrated circuit device: an input/output circuit which inputs and outputs data and instructions; a bus which is coupled to the input/output circuit and serves as a path for transmitting the data and instructions; an operational circuit which is coupled to the bus, receives the data and instructions, and performs operational processing for the data; and a memory module which is coupled to the operational circuit and stores a result of operational processing performed by the operational circuit and instructions to be used by the operational circuit. The memory module includes: a plurality of nonvolatile memory cells, each including a read select gate terminal, a write gate terminal, a data input/output terminal, and a power supply terminal; a plurality of sub-arrays, each including: read gate lines to which the write gate terminals of the nonvolatile memory cells are commonly coupled; read gate line driving circuits which drive the read gate lines; read select gate lines to which the read select gate terminals of the nonvolatile memory cells are commonly coupled; power supply lines to which the power supply terminals of the nonvolatile memory cells are commonly coupled; and data lines each of which is coupled to a subset of the data input/output terminals; a memory array including the sub-arrays, write gate line driving circuits which are provided in common to the read select gate lines included in each of the sub-arrays, power supply line driving circuits which are commonly coupled to the power supply terminals included in each of the sub-arrays, and read gate line transfer circuits which are commonly coupled to the read gate line driving circuits; a write data transfer circuit whose components are coupled respectively to the data lines included in the sub-arrays and transfers data to be written into at least one of the nonvolatile memory cells when writing data into the nonvolatile memory cells; a data line selecting circuit whose components are coupled respectively to the data lines included in the sub-arrays and selects a data line when reading data from at least one of the nonvolatile memory cells; and an amplifier circuit which is commonly coupled to the components of the data line select circuit and amplifies a data signal appearing on the data line selected by the data line selecting circuit. The nonvolatile memory cells comprise complementary storage cells in which one unit of data is stored in a pair of a negative cell for storing negative data and a positive cell for storing positive data.

Other aspect of the present invention are outlined below.

According to a further aspect of the present invention, the above semiconductor integrated circuit includes circuits for selecting a gate line driving circuit to select one of the read gate line driving circuits.

In a further aspect of the present invention, each of the memory cells comprises a split gate type in which an insulating film is formed over a channel region between the data input/output terminal and the power supply terminal, the read select gate terminal is formed over the insulating film in a position nearer to the data input/output terminal, the write gate terminal is formed over the insulating film in a position nearer to the power supply terminal, and a charge storing layer is further formed between the insulating film and the write gate terminal.

According to a further aspect of the present invention, in the memory array, the number of the write gate line driving circuits is smaller than the number of the read gate line driving circuits and the number of the power supply line driving circuits is smaller than the number of the read gate line driving circuits.

In a further aspect of the present invention, the memory module receives via the bus an address signal for selecting at least one of or at least one pair of memory cells, data to be written into the at least one of or the at least one pair of memory cells, and a write instruction, a write gate line driving circuit, a power supply line driving circuit, and a desired read gate line driving circuit included in a desired sub-array are selected according to the address signal, and, via a write data transfer circuit activated by the write instruction, the data is written into the at least one of or the at least one pair of memory cells coupled to the desired read gate line driving circuit included in the desired sub-array.

Advantageous effects obtained by typical aspects of the invention disclosed herein are outlined below.

(1) The number of circuits of MG driver circuits and CG drivers can be reduced and the number of times of disturb occurrence can be decreased, while avoiding an increase in the chip area.

(2) In consequence of the above advantage mentioned in (1), it is possible to improve the reliability of a semiconductor integrated circuit device, while decreasing its size.

BRIEF DESCRIPTION OF THE DRAWINGS

FIG. 12 is an explanatory table illustrative of disturb lessening effects that can be achieved by the memory array of FIG. 5 and by the memory array of FIG. 18.

DETAILED DESCRIPTION OF THE PREFERRED EMBODIMENTS

In the following, embodiments of the present invention will be described in detail based on the drawings. In all the drawings to explain the embodiments, in principle, the same elements are assigned the same reference designations and their repeated explanation is omitted.

First Embodiment

Figure 1:
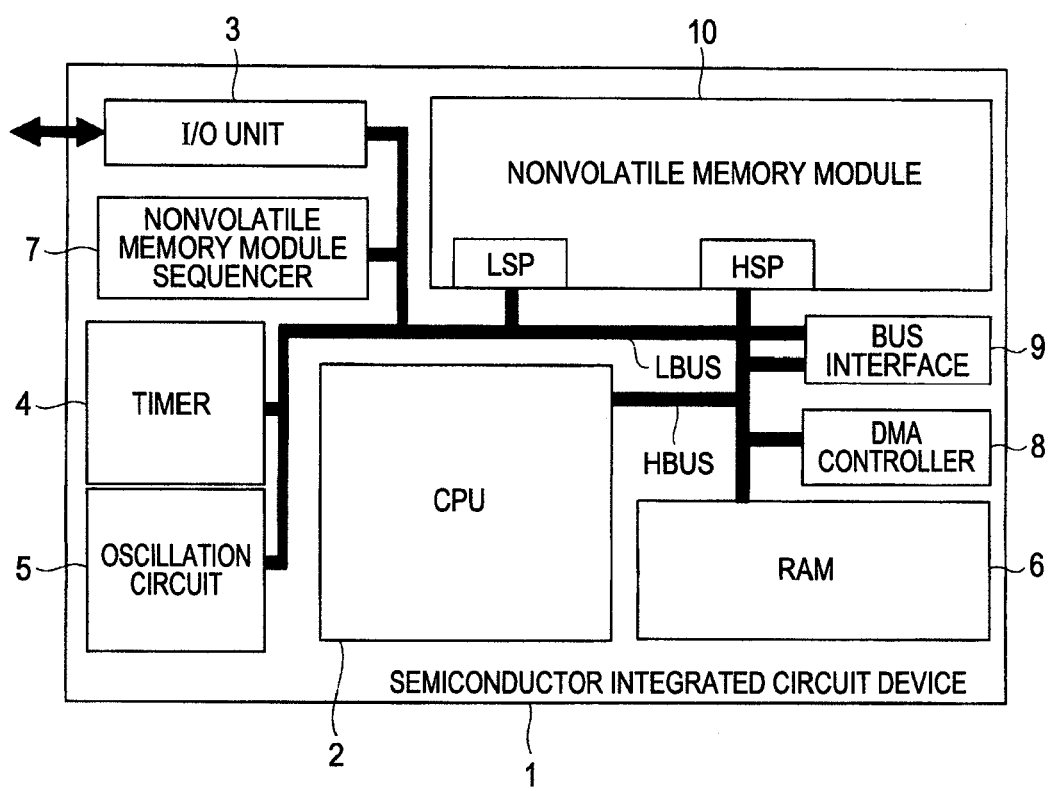
FIG. 1 is a block diagram showing a configuration example of a semiconductor integrated circuit device according to a first embodiment of the present invention.
Figure 2:
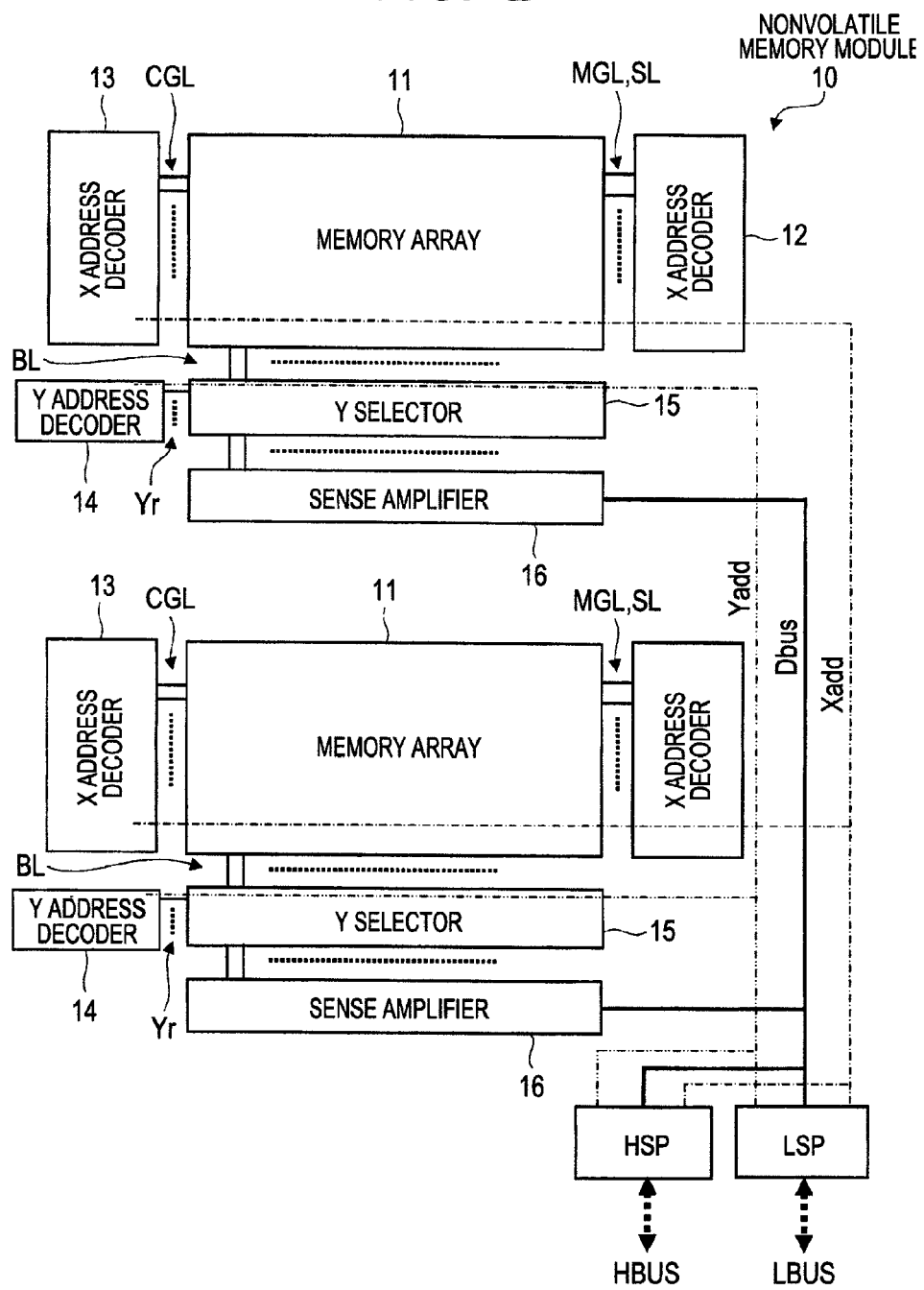
FIG. 2 is an illustrative diagram showing a configuration example of a nonvolatile memory module provided in the semiconductor integrated circuit device of FIG. 1.
Figures 3, 4:
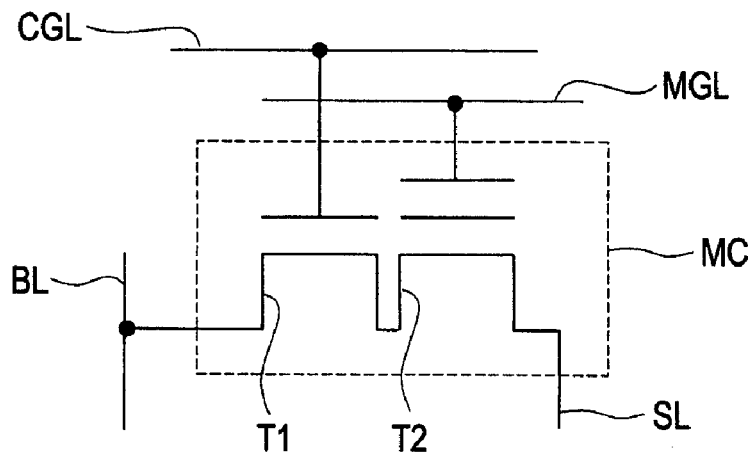
FIG. 3 is an illustrative diagram showing a configuration example of a memory cell provided in the nonvolatile memory module of FIG. 2.
FIG. 4 is an explanatory table listing voltage conditions for write, erase, and read in the memory cell of FIG. 3.
Figure 5:
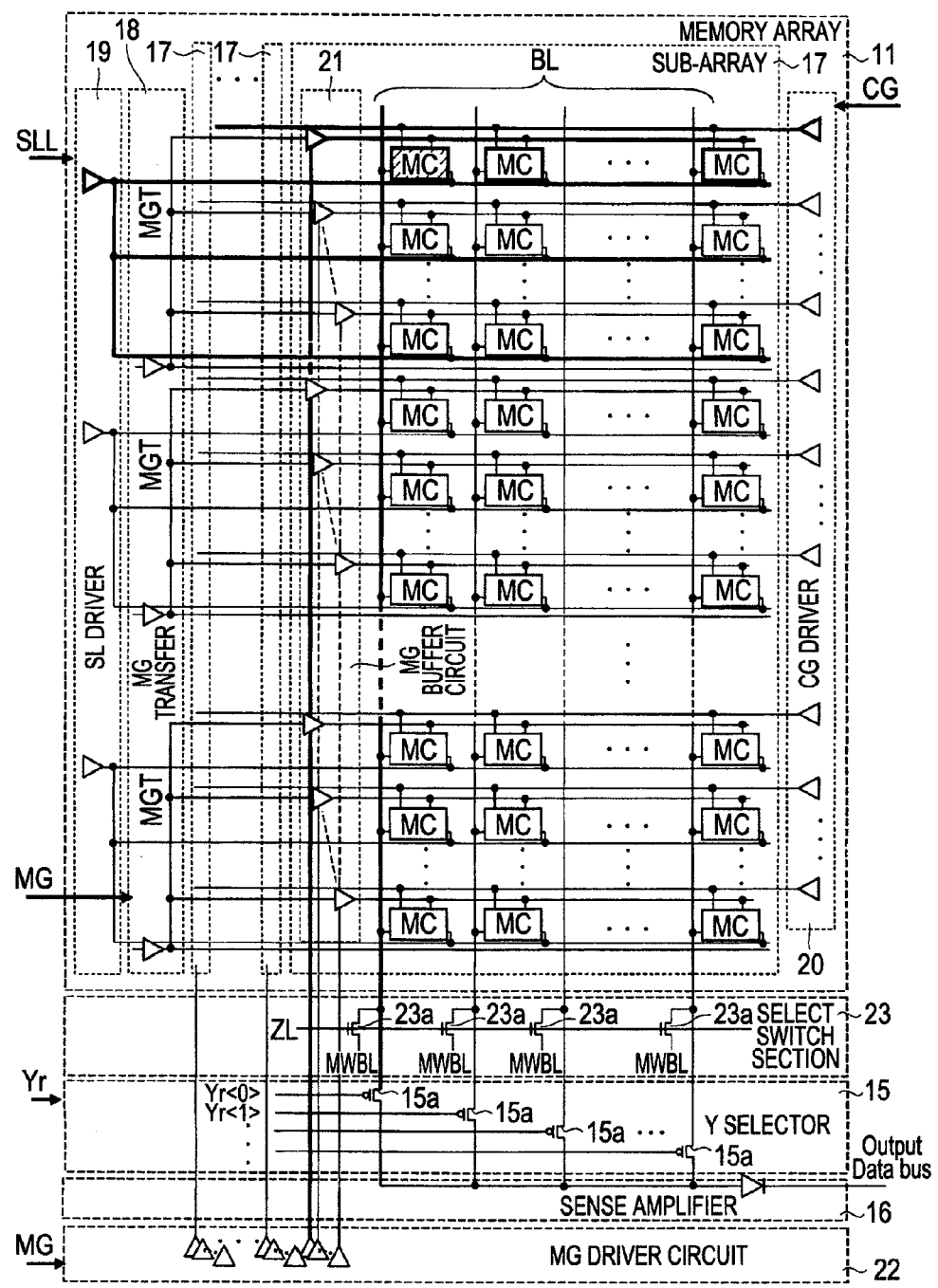
FIG. 5 is an illustrative diagram showing a configuration example of a memory array shown in FIG. 2.
Figure 6:
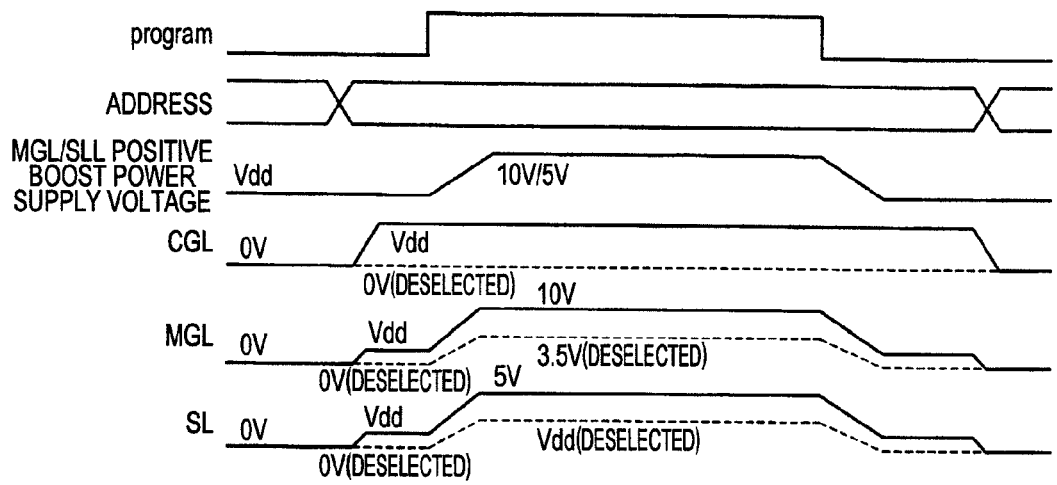
FIG. 6 is a timing chart showing operating waveforms of signals representing an example of write operation in a memory array of FIG. 18.
Figure 7:
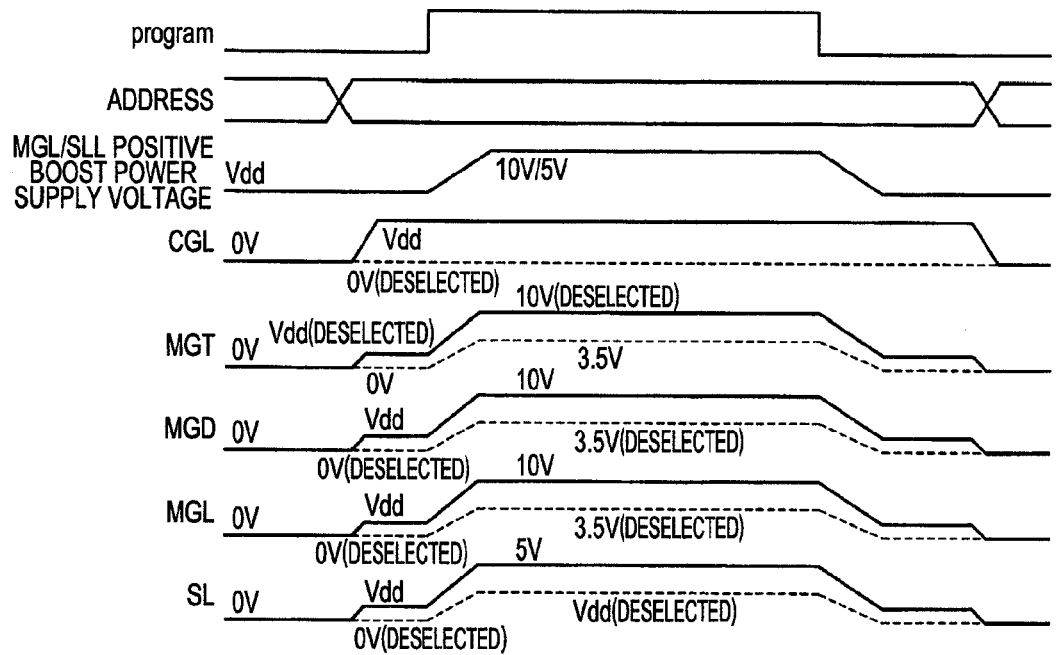
FIG. 7 is a timing chart representing an example of write operation in the memory array of FIG. 5.
Figure 8:
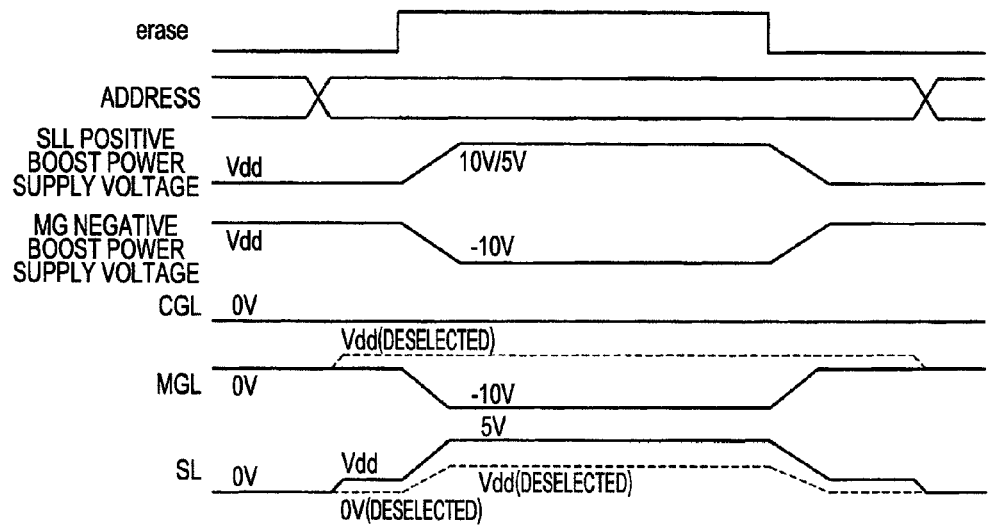
FIG. 8 is a timing chart showing operating waveforms of signals in erase operation of the memory array of FIG. 18.
Figure 9:
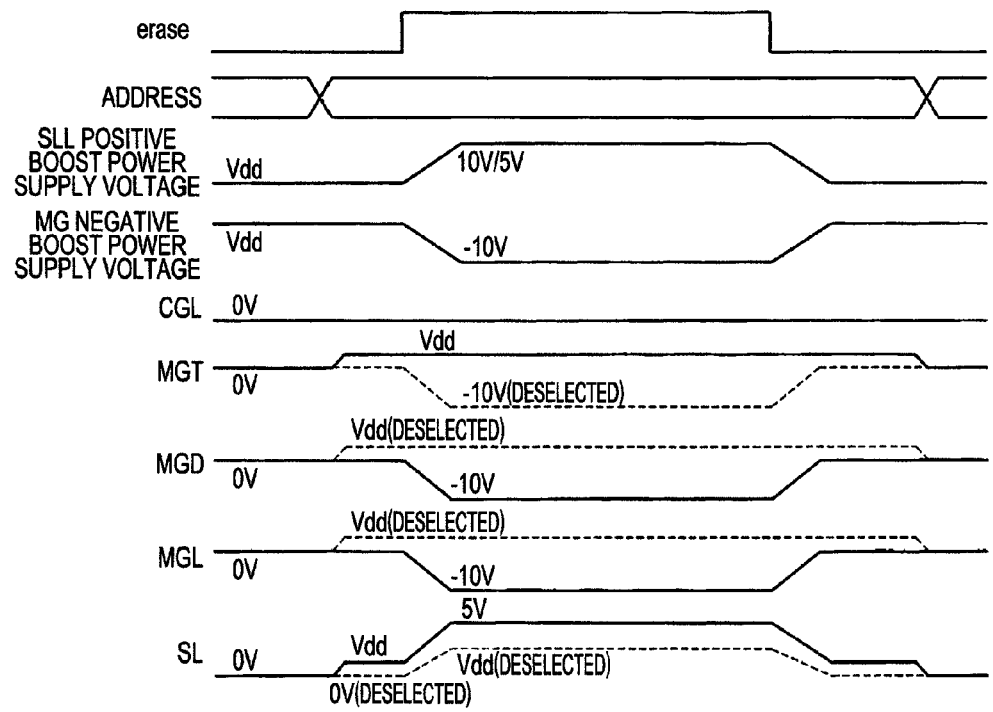
FIG. 9 is a timing chart representing an example of erase operation in the memory array of FIG. 5.
Figure 10:
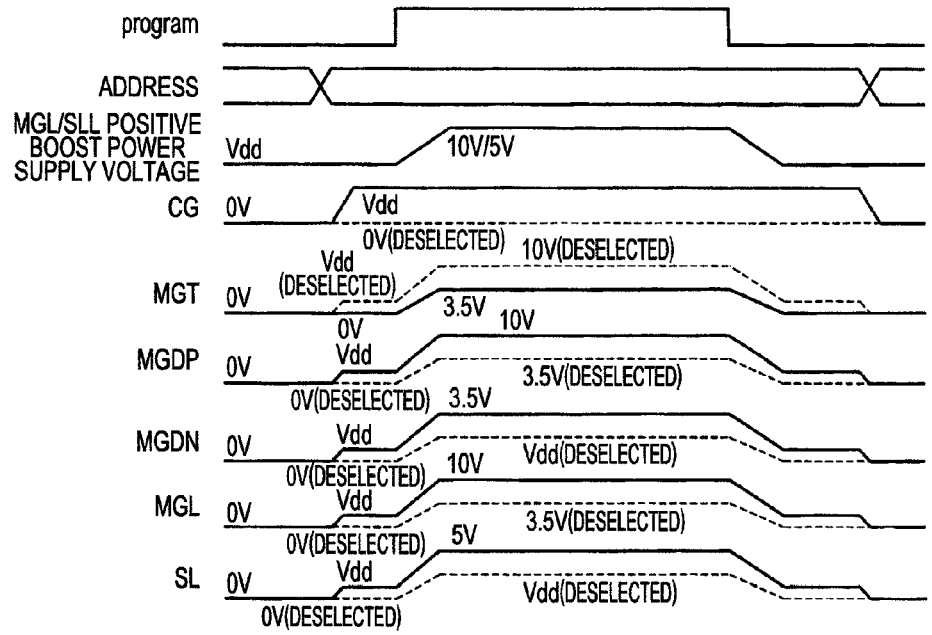
FIG. 10 is an explanatory timing chart representing an example of operation when an MG buffer circuit is configured with CMOS elements according to the first embodiment of the invention.
Figure 11:
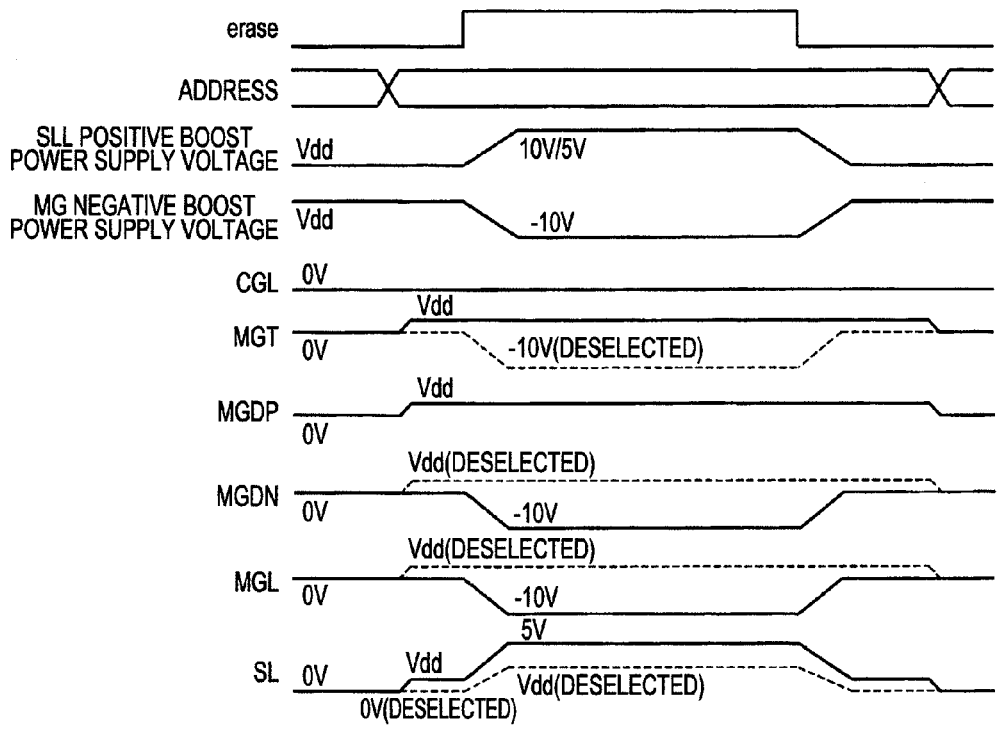
FIG. 11 is an explanatory timing chart representing another example of operation when the MG buffer circuit is configured with CMOS elements as in FIG. 10.

FIG. 1 is a block diagram showing a configuration example of a semiconductor integrated circuit device according to a first embodiment of the present invention. FIG. 2 is an illustrative diagram showing a configuration example of a nonvolatile memory module provided in the semiconductor integrated circuit device of FIG. 1. FIG. 3 is an illustrative diagram showing a configuration example of a memory cell provided in the nonvolatile memory module of FIG. 2. FIG. 4 is an explanatory table listing voltage conditions for write, erase, and read in the memory cell of FIG. 3. FIG. 5 is an illustrative diagram showing a configuration example of a memory array shown in FIG. 2. FIG. 6 is a timing chart showing operating waveforms of signals representing an example of write operation in a memory array of FIG. 18. FIG. 7 is a timing chart representing an example of write operation in the memory array of FIG. 5. FIG. 8 is a timing chart showing operating waveforms of signals in erase operation of the memory array of FIG. 18. FIG. 9 is a timing chart representing an example of erase operation in the memory array of FIG. 5. FIG. 10 is an explanatory timing chart representing an example of operation when an MG buffer circuit is configured with CMOS elements. FIG. 11 is an explanatory timing chart representing another example of operation when the MG buffer circuit is configured with CMOS elements as in FIG. 10. FIG. 12 is an explanatory table illustrative of disturb lessening effects that can be achieved by the memory array of FIG. 5 and by the memory array of FIG. 18.

In the first embodiment, the semiconductor integrated circuit device 1 comprises, for example, a microcomputer or the like. As shown in FIG. 1, the semiconductor integrated circuit device 1 is comprised of a CPU 2 which is an operational circuit, an I/O unit 3 which is an input/output circuit, a timer 4, an oscillation circuit 5, a RAM (Random Access Memory) 6, a nonvolatile memory module sequencer 7, a DMA (Direct Memory Access) controller 8, a bus interface 9, a nonvolatile memory module 10 which is a memory module, and so on.

The CPU 2 exerts overall control of the semiconductor integrated circuit device 1. The I/O unit 3 is an interface for input and output signals and the timer 4 counts time and notifies the CPU 2 or the like that any given time has elapsed. The oscillation circuit 5 generates any clock signal and supplies the clock signal to each block as an operating clock signal.

The RAM 6 is a volatile memory and functions as a working area or the like for the CPU 2. The nonvolatile memory module sequencer 7 controls the operation of the nonvolatile memory module 10.

The DMA controller 8 performs data transfer to/from the RAM 6 and other peripheral circuits without intervention of the CPU 2. The nonvolatile memory module 10 comprises a nonvolatile memory module typified by a flash memory and stores any information such as data and programs.

The CPU 2, RAM 6, DMA (Direct Memory Access) controller 8, bus interface 9, and nonvolatile memory module 10 are interconnected via a high-speed transmission bus HBUS that is capable of high-speed data transmission.

Further, the I/O unit 3, timer 4, oscillation circuit 5, nonvolatile memory module sequencer 7, and nonvolatile memory module 10 are interconnected via a low-speed transmission bus LBUS for data transmission at a lower speed than the high-speed transmission bus HBUS. The bus interface 9 is an interface between the high-speed transmission bus HBUS and the low-speed transmission bus LBUS.

FIG. 2 is an illustrative diagram showing a configuration example of the nonvolatile memory module 10.

As shown, the nonvolatile memory module 10 has a memory array(s) 11 that includes a plurality of memory cells MCs (FIG. 3). The following are coupled to the memory array 11: an X address decoder 12 to select and drive one of memory gate lines MGLs serving as read gate lines and one of source lines SLs, respectively; an X address decoder 13 to select and drive one of control gate lines CGLs which are read select gate lines; a Y address decoder 14 to select one of bit lines BLs which are signal lines to transfer data that is input to or output from a memory cell MC; and a Y selector 15 serving as a data line selecting circuit.

Also, a sense amplifier 16 serving as an amplifier to amplify a cell read signal of a memory cell MC is coupled to the Y selector 15.

X address signal line Xadd and Y address signal line Yadd to control the above X address decoder 12, X address decoder 13, Y address decoder 14, and Y selector 15 as well as I/O data bus Dbus to transfer data that is read from a memory cell MC or written into a memory cell MC are coupled to both a high-speed access port HSP and a low-speed access port LSP. The HSP is coupled to the high-speed transmission bus HBUS and the LSP is coupled to the low-speed transmission bus LBUS. In response to an operation command, sending and receiving data to/from the CPU 2, RAM 6 and the like are performed.

There is no limitation to two sets of memory array 11, X address decoder 12, X address decoder 13, Y address decoder 14, and Y selector 15, as shown in FIG. 2. The memory module may comprise two or more sets of them or only a single set of them and the number of sets can be selected by the designer appropriately.

FIG. 3 is an illustrative diagram showing a configuration example of a memory cell MC.

As shown, a memory cell MC uses, for example, a split gate configuration comprised of two transistors T1, T2. Control signals to control the memory cell MC may be a control gate signal which is applied to a gate (read select gate terminal) of a transistor T1 via a control gate line CGL, a memory gate signal which is applied to a gate (write gate terminal) of a transistor T2 via a memory gate line MGL, a select signal which is supplied to one terminal (data input/output terminal) of the transistor T1 via a bit line BL, and a select signal which is supplied to one terminal (power supply terminal) of the transistor T2 via a source line SL.

The memory cell MC may be of a known stack gate type, besides the split gate configuration shown in FIG. 3, and its configuration can be selected by the designer appropriately.

FIG. 4 is an explanatory table listing voltage conditions for write, erase, and read in the memory cell MC.

For example, in the case of read operation, a voltage of about 1.5V is applied to the bit line BL and the control gate line CGL, respectively, and a voltage of about 0 v is supplied to the memory gate line MGL and the source line SL.

When writing, a voltage of about 0 V is applied to the bit line BL and a voltage of about 1.0 V to the control gate line CGL, respectively, and a voltage of about 10V is applied to the memory gate line MGL and a voltage of about 5V to the source line SL, respectively.

At this time, for a deselected memory cell, a voltage of about 1.5 V is applied to the bit line BL, a voltage of about 0.0 V to the control gate line CGL, a voltage of about 3.5 V to the memory gate line MGL, and a voltage of about 1.5 V to the source line SL, respectively.

Further, when erasing data, a voltage of about 1.5 V is applied to the bit line BL, a voltage of about 0.0 V to the control gate line CGL, a voltage of about −10 V to the memory gate line MGL, and a voltage of about 5V to the source line SL, respectively.

FIG. 5 is an illustrative diagram showing a configuration example of a memory array 11 shown in FIG. 2.

As shown, the memory array 11 is comprised of a plurality of sub-arrays 17, MG transfers 18 serving as gate line transfer circuits, SL drivers 19, and CG drivers 20 which are write gate line driving circuits. Each sub-array 17 includes a plurality of memory cells MCs and MG buffer circuits 21 serving as read gate line driving circuits.

The sub-array 17 includes a plurality of memory gate lines MGLs, control gate lines CGLs, source lines SLs and bit lines BLs and the memory cells MCs are respectively arranged in positions where the memory gate lines MGLs, control gate lines CGLs, and source lines SLs intersect with the bit lines BLs.

A memory gate line MGL selects a desired memory cell MC to which data is to be written. A control gate line CGL runs in parallel with the memory gate line MGL and selects a desired memory cell MC from which data is to be read.

A source line SL runs in parallel with the memory gate line MGL and the control gate line CGL. The source line SL is coupled to the source terminal of a transistor T2 serving as a select transistor included in a memory cell MC.

A bit line BL runs so as to intersect with the memory gate line MGL, control gate line CGL, and source line SL. The bit line is coupled to the drain terminal of a transistor T1 serving as a select transistor included in a memory cell MC and transfers data that is written into or read from the memory cell MC.

Each of the memory gate lines MGL is coupled to memory cells MCs included in one sub-array 17, respectively. Each sub-array 18 is provided with MG buffer circuits 21.

Each of the MG buffer circuits 21 is provided for each memory gate line MGL and its activation/deactivation is controlled by a control signal MGT that is common for a predetermined number of MG buffer circuits 21 included in each sub-array 17.

A potential (e.g., about 10V) that is used to control writing of a memory cell MC is generated by one of MG driver circuits 22 coupled to the sub-arrays 17. The MG driver circuits 22 serve as circuits for selecting a gate line driving circuit. This potential is supplied to an MG buffer circuit 21 via a common control signal MGD (alternatively, a control signal MGDP for P-type MOSFET and a control signal MGDN for N-type MOSFET in a case that an MG buffer circuit 21 is configured with CMOS (Complementary Metal Oxide Semiconductor) elements).

A control signal MGT is selected according to a control signal MG that is supplied from the X address decoder 12, based on an address signal transmitted on the X address signal line Xadd. Activation/deactivation of a CG driver 20 is controlled by a control signal CG supplied from the X address decoder 13, based on an address signal transmitted on the X address signal line Xadd.

For the source lines SLs as well, similarly, activation/deactivation of a source line SL is controlled by a control signal SLL supplied from the X address decoder 13 via a power supply line, based on an address signal transmitted on the X address signal line Xadd.

The memory array 11 is configured such that the control gate lines CGLs, CG drivers 20, source lines SLs, and SL drivers 19 are common to the sub-arrays 17, whereas the memory gate lines MGLs and MG buffer circuits 21 are provided for each sub-array 17.

By thus configuring the memory array 11, the units in which data is written can be decreased without increasing the circuit size of the memory array 11.

Now, a further description is provided for other components of the memory array 11.

First, for write operation, write data to be written to a memory cell, which is based on data that has been input via the I/O data bus Dbus, is supplied via a write line MWBL to a bit line BL by a select switch section 23. The select switch section 23 serves as a write data transfer circuit which is controlled by a control line ZL supplied from a control circuit which is not shown.

The select switch section 23 is comprised of a plurality of transistors 23a which function as switches. One terminal of each of these transistors 23a is coupled to each bit line BL, respectively.

A write line MWBL is coupled to the other terminal of each of the transistors 23a and the control line ZL is coupled to the gates of these transistors 23a.

Further, the Y selector 15 is comprised of a plurality of transistors 15a. Each bit line BL is coupled to one terminal of each of the transistors 15a, respectively. Lines of control signals Yr<0> to Yr<n> which are supplied from the Y address decoder 14 are coupled to the gates of these transistors 15, respectively, so that these control signals are input to the gates. The other terminals of the transistors 15a are coupled to the input lines to the sense amplifier 16.

Next, for read operation, data that has been read from a memory cell MC selected by a control signal transmitted on a control gate line CGL is transferred via its bit line BL. The Y selector 15 selects this bit line BL according to a control signal Yr supplied from the Y address decoder 14, based on Y address signal Yadd, and the read data on the selected bit line BL is input to the sense amplifier 16. The sense amplifier 16 is provided for each sub-array 17.

Then, the read data amplified by the sense amplifier 16 is transferred through the I/O data bus Dbus to either the high-speed access port HSP or the low-speed access port LSP.

Figure 18:
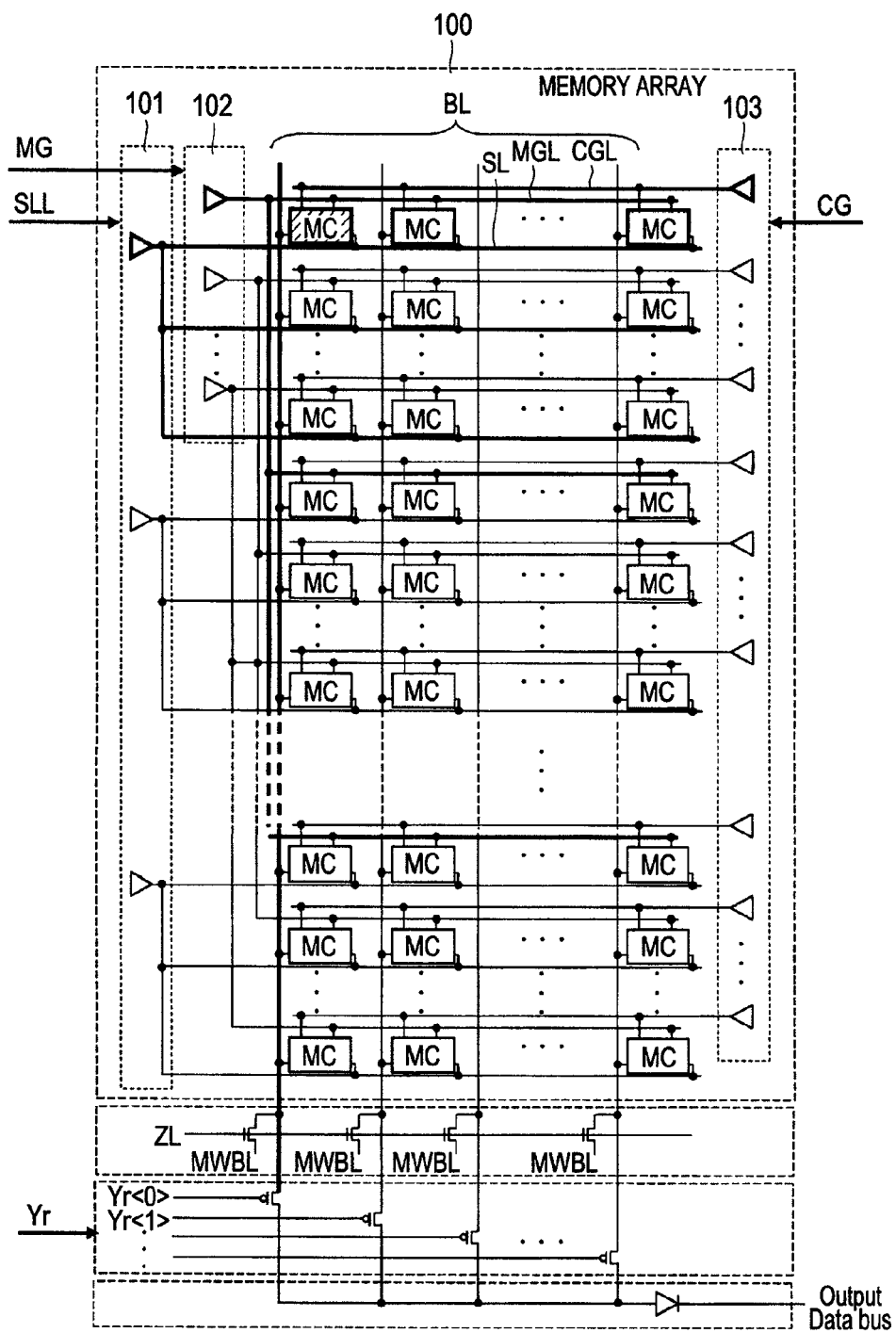
FIG. 18 is an illustrative diagram showing a configuration example of a memory array provided in a flash memory module examined by the present inventors.
Figure 19:
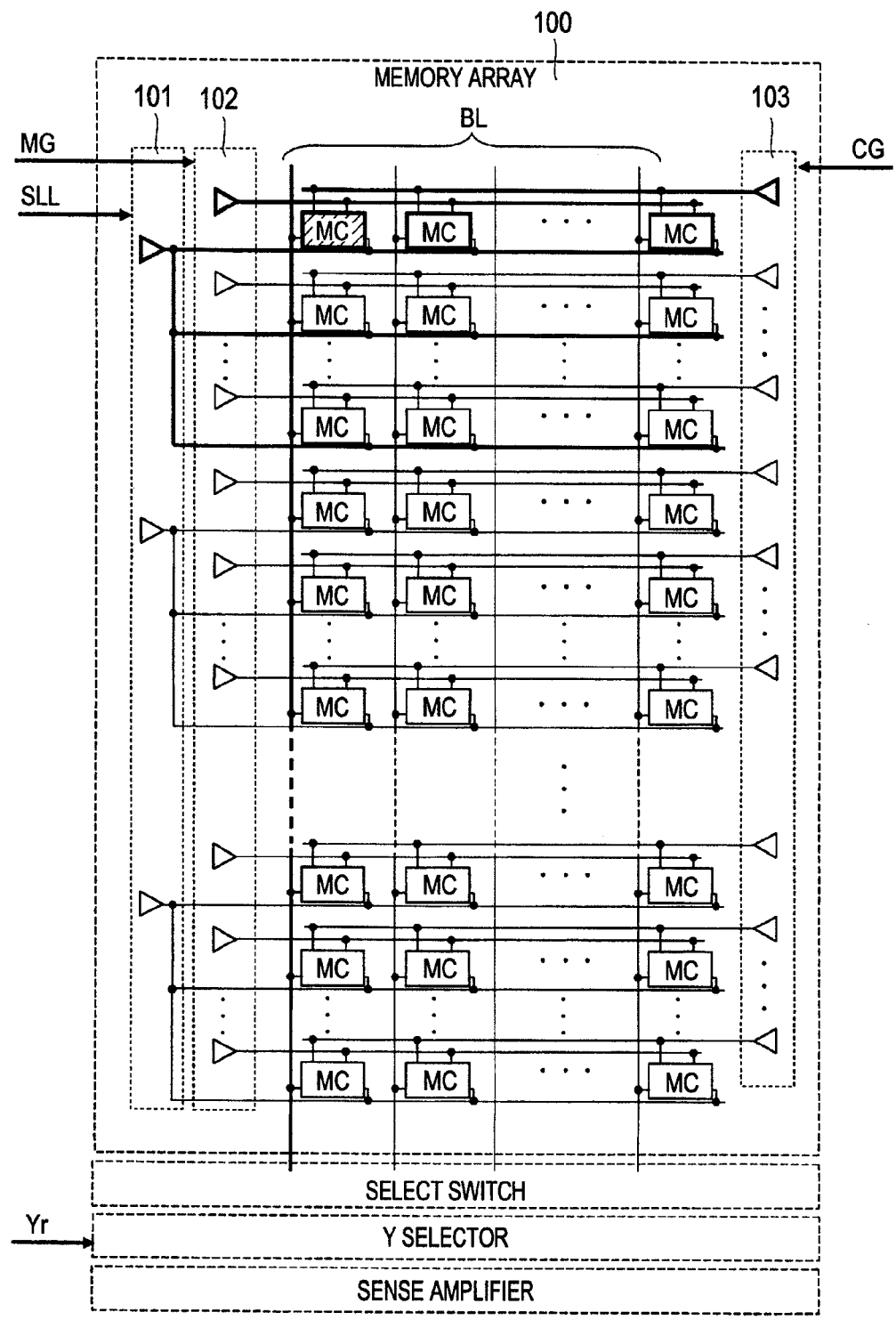
FIG. 19 is an illustrative diagram showing an example of modification to the memory array of FIG. 18 examined by the present inventors.
Figure 20:
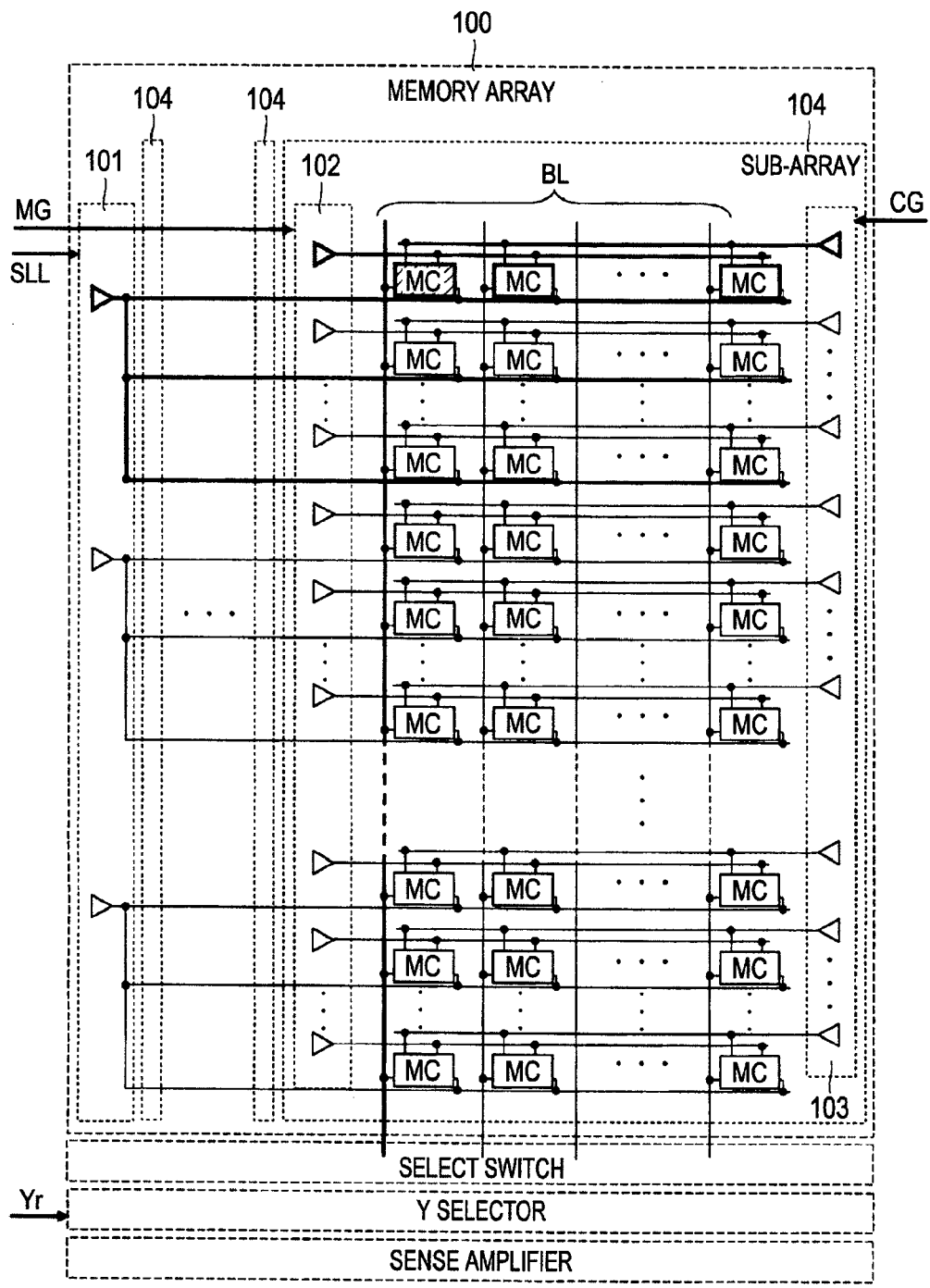
FIG. 20 is an illustrative diagram showing another example of modification to the memory array of FIG. 18 examined by the present inventors.

Here, comparison is made between the above-discussed configuration of the memory array 100 examined by the present inventors as shown in FIG. 18 and the configuration of the memory array in FIG. 5.

FIG. 6 is a timing chart showing operating waveforms of signals representing an example of write operation in the memory array 100 of FIG. 18.

First, when an address signal indicating a desired memory cell MC is input to the nonvolatile memory module, a control gate line CGL, a memory gate line MGL, and a source line SL are selected by the X address decoder and the voltages of these lines rise to a select potential (a power supply voltage Vdd in FIG. 6).

Then, when a write command signal "program" is input to the nonvolatile memory module, a control signal SLL is input to an SL driver circuit 101 and a control signal MG to an MG driver 102, respectively, and the memory gate line MGL and the source line SL change to a write potential (10V in FIG. 6).

After the write command signal "program" falls, which indicates the end of the write operation, the control signals MGL and SLL return to the potential before the write operation (the power supply voltage Vdd in FIG. 6). After that, the voltages of the control gate line CGL, memory gate line MGL, source line SL are once decreased to the select level (the power supply voltage Vdd in FIG. 6) and then fall to a deselect level (0 V in FIG. 6).

FIG. 7 is a timing chart representing an example of write operation in the memory array 11 of FIG. 5.

A difference from the timing chart of FIG. 6 is that control signals MGT and MGD to control an MG buffer circuit 21 are added, because the MG drivers 102 shown in FIG. 18 are hierarchized into MG driver circuits 22 and MG buffer circuits 21 in FIG. 5.

Similarly to the timing chart of FIG. 6, when an address signal is input, the selected control gate line CGL, memory gate line MGL, and source line SL change to the select level. After that, when a write command signal "program" is input to the nonvolatile memory module 10, a desired MG driver circuit 22 is selected according to the control signal MG and a write potential (10V in FIG. 7) is applied to the relevant MG buffer circuit 21 by the control signal MGD. An MG transfer 18 selected by the control signal MGL outputs a control signal MGT to activate the MG buffer circuit 21. Then, the memory gate line MGL changes to the write potential through the desired MG buffer circuit 21.

FIG. 8 is a timing chart showing operating waveforms of signals in erase operation of the memory array 100 of FIG. 18.

When an address signal indicating a desired memory cell MC is input to the nonvolatile memory module, a memory gate line MGL and a source line SL are selected by the address decoder. The voltage of the selected memory gate line MGL remains at a potential before the input of the address signal (the voltage of deselected memory gate lines MGLs rises to the power supply voltage Vdd). The voltage of the source line SL rises to the select potential (power supply voltage Vdd in FIG. 8).

After that, when an erase command signal "erase" is input to the nonvolatile memory module, a control signal SLL is input to an SL driver circuit 101 and a control signal MGL to an MG driver 102, respectively. The memory gate line MGL and source line SL change to erase potentials (−10V for MGL and 5 V for SL in FIG. 8).

Then, when the erase command signal "erase" falls, which indicates the end of the erase operation, the control signals MGL and SLL return to the potential before the erase operation (power supply voltage Vdd in FIG. 8). After that, the memory gate line MGL returns to the potential before the input of the erase command signal "erase" (0 V in FIG. 8). The voltage of the source line SL is once decreased to the select level (power supply voltage Vdd in FIG. 8) and changes to a deselect level (0 V in FIG. 8) (the voltage of deselected memory gate lines MGLs remains at the power supply voltage Vdd even upon the input of the erase command signal "erase" and then falls to 0 V as the source line SL does). The voltage of control gate lines CGLs remains at the deselect level (0 V in FIG. 8), as these lines are not selected during an erase operation.

FIG. 9 is a timing chart representing an example of erase operation in the memory array 11 of FIG. 5.

In this case, a difference from the timing chart of FIG. 8 is that control signals MGT and MGD to control an MG buffer circuit 21 are added, as is the case for the waveforms of the signals for write operation.

Similarly to the timing chart of FIG. 8, when an address signal is input, the voltage of the selected memory gate line MGL remains at a potential before the input of the address signal (the voltage of deselected memory gate lines MGLs rises to the power supply voltage Vdd). The selected source line SL changes to the select level (power supply voltage Vdd in FIG. 9). After that, when an erase command signal "erase" is input to the nonvolatile memory module 10, a desired MG driver circuit 22 is selected according to the control signal MG and erase potentials (−10 V on the memory gate line MGL and 5 V on the source line SL in FIG. 9) are applied to the relevant MG buffer circuit 21 by the control signal MGD. An MG transfer 18 selected by the control signal MGL outputs a control signal MGT to activate the MG buffer circuit 21. Then, the memory gate line MGL changes to the erase potential through the desired MG buffer circuit 21.

The voltage of control gate lines CGLs remains at the deselect level (0 V in FIG. 9), as these lines are not selected during an erase operation, as is the case for FIG. 8.

Further, FIGS. 10 and 11 show examples or operation when an MG buffer circuit 21 shown in FIG. 5 is configured with CMOS elements which are not shown. In this case, a difference from the timing chart of FIG. 7 is that the control signal MGD is separated into a power supply MGDP for P-type MOSFET and a power supply MGDN for N-type MOSFET and these two signals are supplied. Others are as described with regard to FIG. 7 and FIG. 9, so a further description is omitted.

FIG. 12 is an explanatory table illustrative of disturb lessening effects that can be achieved by the memory array 11 of FIG. 5 and by the memory array 100 examined by the present inventors and shown in FIG. 18.

As can be seen, it is possible to significantly reduce the number of times of disturb occurrence by hierarchization of MG buffer circuits 21 and by dividing the memory array 11 into a plurality of sub-arrays 17 in comparison to the case where hierarchization of MG buffer circuits 21 and division into a plurality of sub-arrays 17 are not practiced.

Thereby, according to the first embodiment, by hierarchization of the MG buffer circuits 21 that drive and select one of the memory gate lines MGLs for selecting a cell to which data is to be written and by dividing the memory array 11 into a plurality of sub-arrays 17, it is feasible to reduce the number of circuits of MG driver circuits 22 and CG drivers and lessen the number of times of disturb occurrence, while avoiding an increase in the chip area.

Second Embodiment

Figure 13:
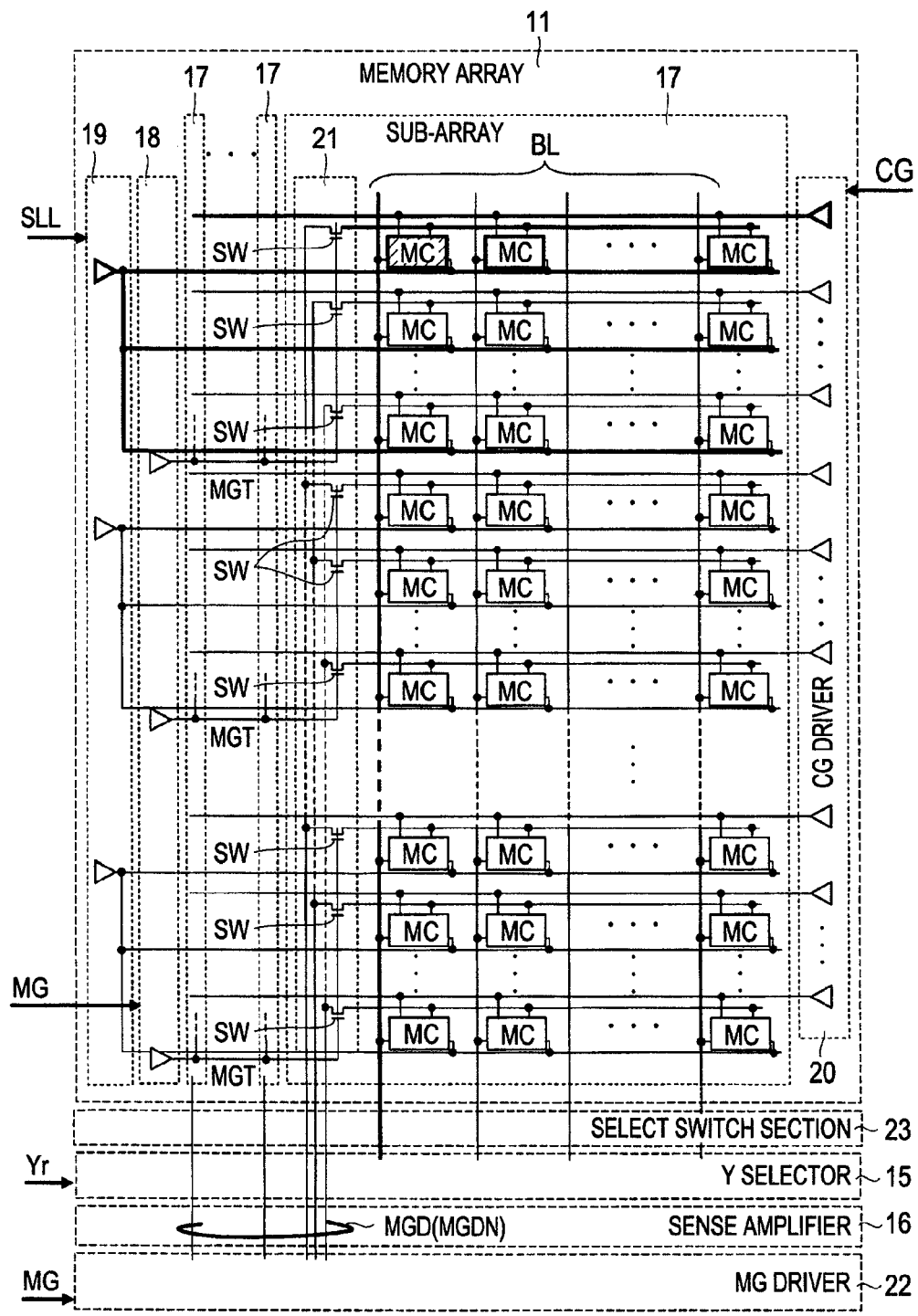
FIG. 13 is an illustrative diagram showing a configuration example of a memory array according to a second embodiment of the present invention.
Figure 14:
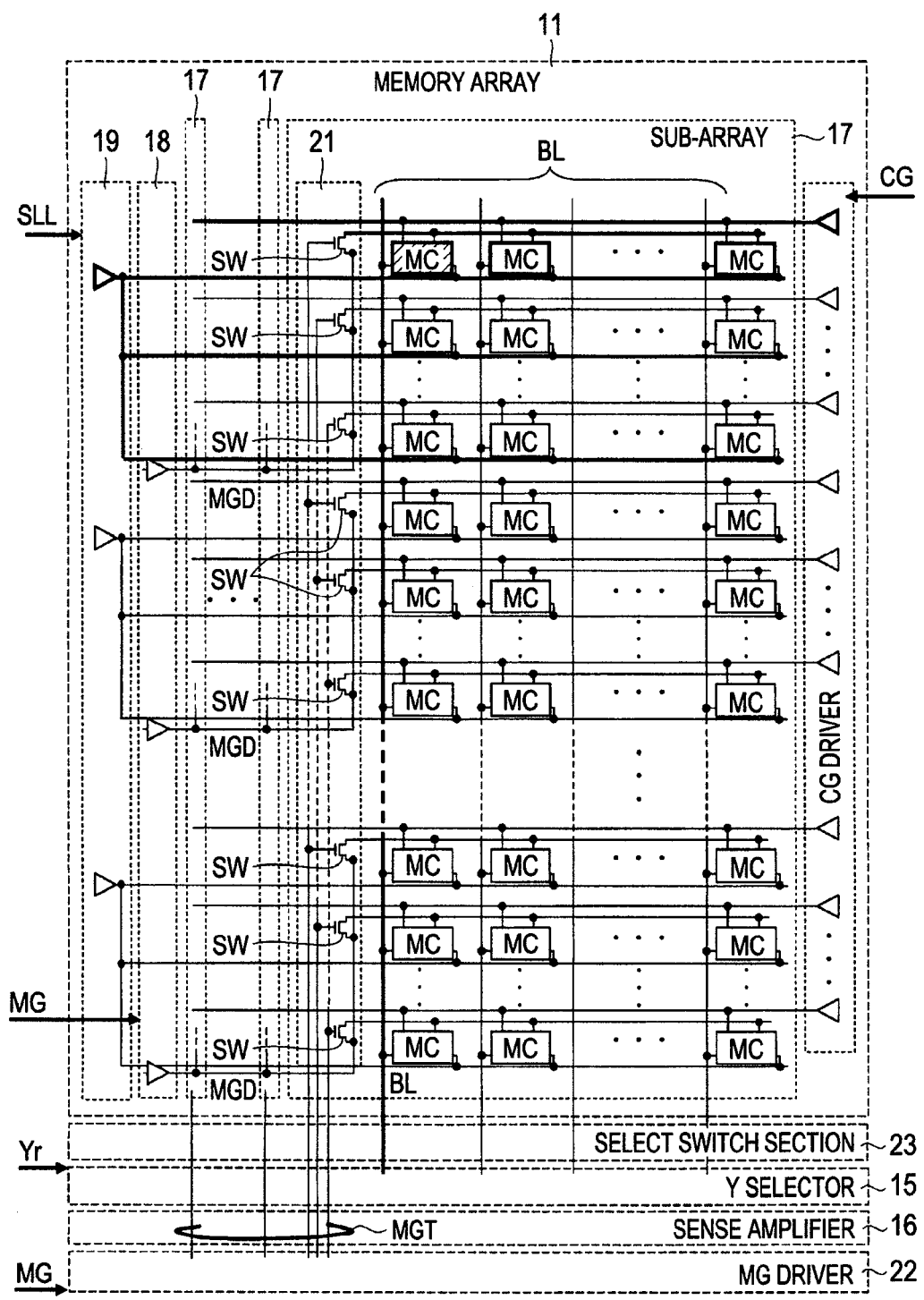
FIG. 14 is an illustrative diagram showing another configuration example of the memory array of FIG. 13.

FIG. 13 is an illustrative diagram showing a configuration example of a memory array according to a second embodiment of the present invention. FIG. 14 is an illustrative diagram showing another configuration example of the memory array of FIG. 13.

In the second embodiment, FIG. 13 shows an example of modification to the first embodiment, wherein the elements of the MG buffer circuits 21 shown in FIG. 5 are replaced by switch transistors.

The MG buffer circuits 21 shown in FIG. 5 for the preceding first embodiment are, for example, of a CMOS type which comprises a p-conducting (P-type) MOSFET and an n-conducting (N-type) MOSFET which are not shown. However, in FIG. 13 for the second embodiment, the components of the MG buffer circuits 21 are replaced by switch transistors SWs and these transistors SWs (e.g., N-type MOSFETs) are on/off controlled by a control signal MGT. Therefore, a control signal MGDN is only supplied to the MG buffer circuits 21.

FIG. 14 shows an example of modification to the memory array of FIG. 13, wherein the switch transistors SWs are on/off controlled by MG driver circuits 22. Other parts of configuration are the same as in the preceding first embodiment.

Accordingly, it becomes possible to reduce the number of elements in the MG buffer circuits 21 and the layout area can be decreased.

As for the operation of the memory arrays of FIG. 13 and FIG. 14, write operation is the same as described with regard to FIG. 7 for the preceding first embodiment and erase operation is the same as described with regard to FIG. 9 for the preceding first embodiment, so a further description is omitted.

A difference in writing operation from the operation of the memory array of FIG. 5 is that a control signal MGDN to control an MG buffer circuit 21 is supplied from an MG driver circuit 22 and a write potential (e.g., 10 V) and a potential (e.g., −10 V) which is used for erase control are provided by the control signal MGDN.

Thereby, in the second embodiment, it is feasible to decrease the size of the MG buffer circuits 21 and, thus, avoid an increase in the chip area more efficiently, while lessening the number of times of disturb occurrence.

Third Embodiment

Figure 15:
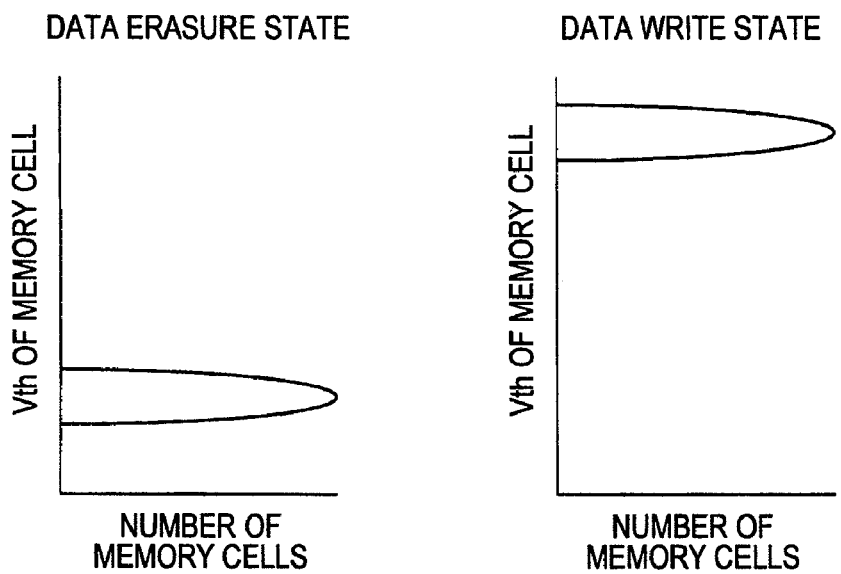
FIG. 15 is a set of graphs to explain an example of threshold voltage control for memory cells according to a general method of storing one unit of data per cell.
Figure 16:
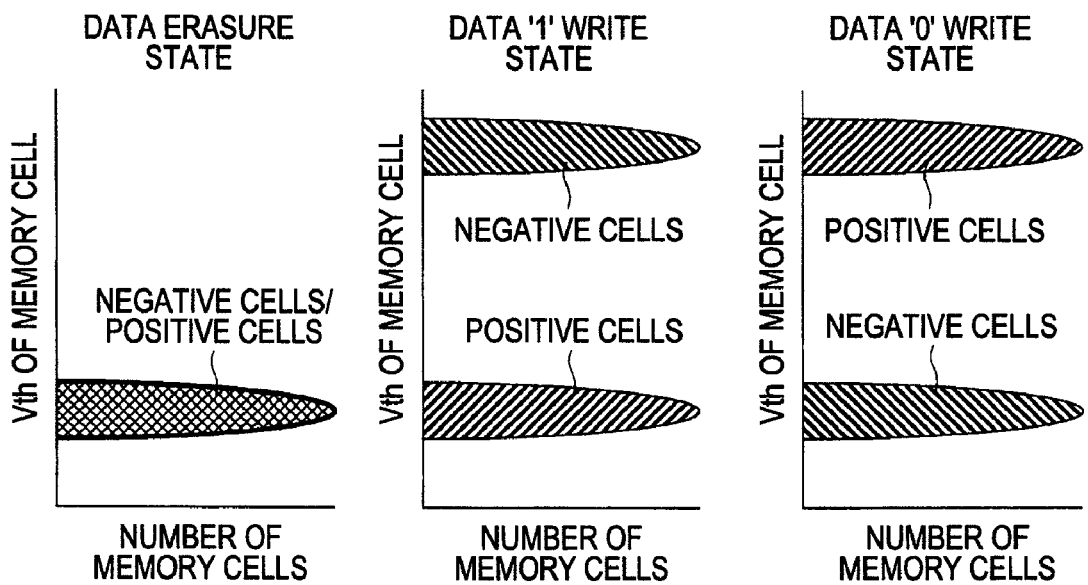
FIG. 16 is a set of graphs to explain an example of threshold voltage control for memory cells provided in a memory array according to a third embodiment of the present invention.
Figure 17:
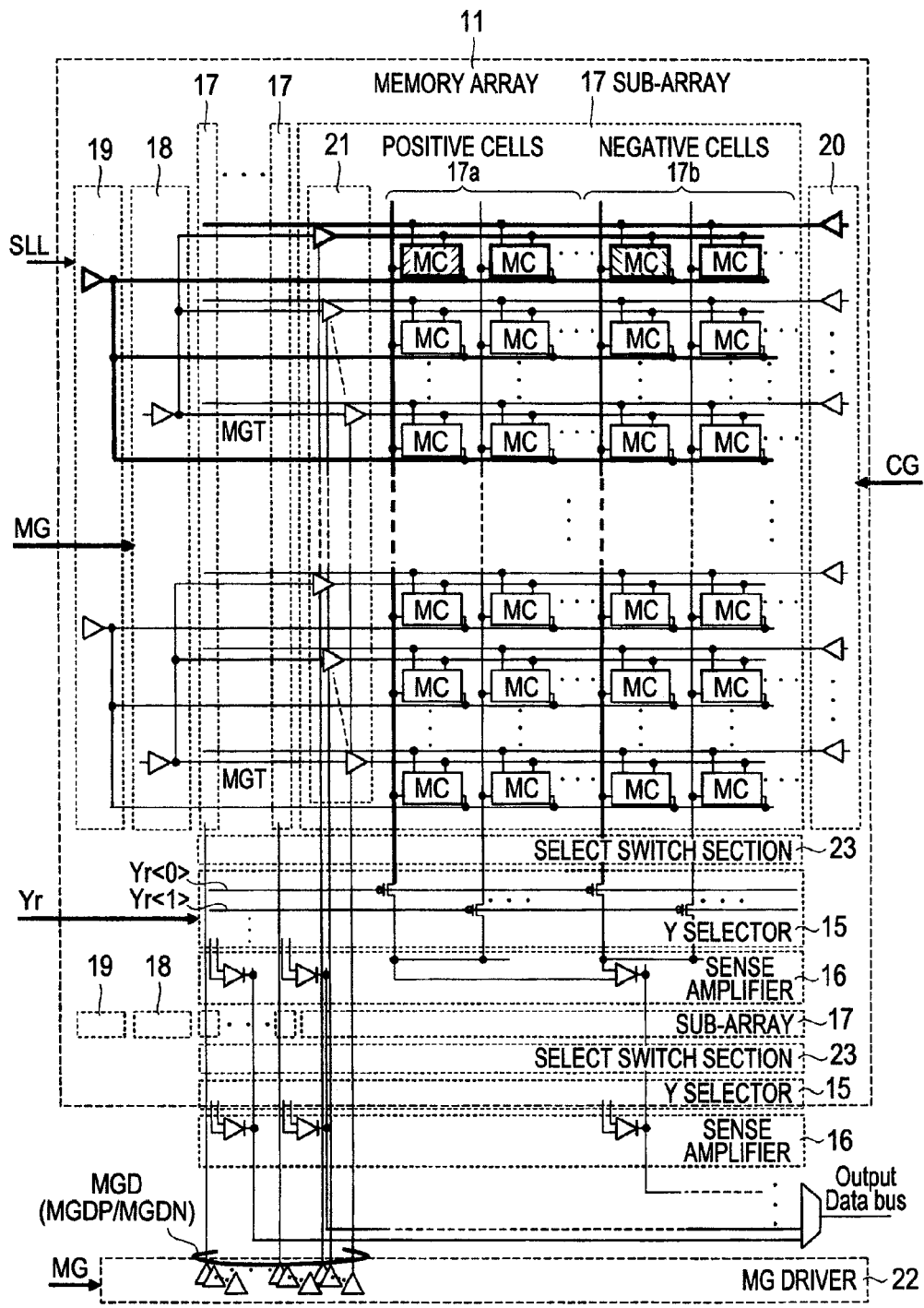
FIG. 17 is an illustrative diagram showing a configuration example of a memory array according to the third embodiment of the present invention.

FIG. 15 is a set of graphs to explain an example of threshold voltage control for memory cells according to a general method of storing one unit of data per cell. FIG. 16 is a set of graphs to explain an example of threshold voltage control for memory cells provided in a memory array according to a third embodiment of the present invention. FIG. 17 is an illustrative diagram showing a configuration example of a memory array according to the third embodiment of the present invention.

In the third embodiment, a complementary storage method that stores one unit of data using two memory cells is applied to the memory array configuration described in the preceding first embodiment.

Here, the complementary storage method is explained.

In the general method of storing one unit of data using one memory cell (storing one unit of data per cell), the threshold voltage for the transistors constituting each memory cell is controlled so that the threshold voltage in a data write state will be higher than that in a data erasure state, as illustrated in FIG. 15.

In contrast, in the case of the complementary storage method that stores one unit of data using two memory cells (storing one unit of data per two cells) shown in FIG. 16, the memory cells are used in pairs of two types of cells; i.e., a negative cell for storing negative data and a positive cell for storing positive data.

The threshold voltages of the memory cells are controlled as follows. In the erasure state, the threshold voltages of both positive and negative memory cells are low. In the write state, when storing data "1", the threshold voltage of a negative memory cell is higher than that of a positive memory cell. When storing data "0", the threshold voltage of a positive memory cell is higher than that of a negative memory cell.

FIG. 17 is an illustrative diagram showing a configuration example of a memory array, when the complementary storage method is applied to the memory array configuration of FIG. 5.

In this case, a difference from the memory array configuration of FIG. 5 is that one sub-array 17 comprises two regions, one for positive cells 17a and the other for negative cells 17b.

In read operation, data that has been read from a pair of a positive memory cell 17a and a negative memory cell 17b selected by a control gate line CGL is transferred via their bit lines BLs. The Y selector 15 selects these bit lines BLs according to a control signal Yr supplied from the Y address decoder 14 (FIG. 2), based on Y address signal Yadd, and the read data on the selected bit lines BLs is input to the sense amplifier 16.

A difference from the preceding first embodiment is that two bits lines coupled to a positive cell 17a and a negative cell 17b are selected per unit of data and, consequently, a difference between data signals on both bit lines BLs selected is amplified by the sense amplifier 16.

By the above-described reading method, it is possible to read stored data, even if the retention performance of memory cells MCs has been deteriorated.

Accordingly, in the third embodiment, even when the method of storing one unit of data per two cells is applied, by hierarchization of the MG buffer circuits 21 that drive and select one of the memory gate lines MGLs for selecting a cell to which data is to be written and by dividing the memory array 11 into a plurality of sub-arrays 17, it is feasible to reduce the number of MG driver circuits 22 and CG drivers and lessen the number of times of disturb occurrence, while avoiding an increase in the chip area, as is the case for the preceding first embodiment.

While the invention made by the present inventors has been described specifically based on its embodiments hereinbefore, it will be appreciated that the present invention is not limited to the described embodiments and various modifications may be made without departing from the subject matter of the invention.

The present invention is suitable for a semiconductor integrated circuit device such as a microcomputer including a nonvolatile memory module that implements writing in small byte units.

What is claimed is:
1. A semiconductor integrated circuit device comprising:
 a plurality of nonvolatile memory cells, each including:
  a read select gate terminal;
  a write gate terminal;
  a data input/output terminal; and
  a power supply terminal;
 a plurality of sub-arrays, each including:
  read gate lines to which the write gate terminals of said nonvolatile memory cells are commonly coupled;
  read gate line driving circuits which drive said read gate lines;
  read select gate lines to which the read select gate terminals of said nonvolatile memory cells are commonly coupled;
  power supply lines to which the power supply terminals of said nonvolatile memory cells are commonly coupled; and
  data lines each of which is coupled to said data input/output terminals;
 a memory array including:
  the sub-arrays;
  write gate line driving circuits which are provided in common to the read select gate lines included in each of said sub-arrays;
  power supply line driving circuits which are commonly coupled to said power supply terminals included in each of said sub-arrays; and
  read gate line transfer circuits which are commonly coupled to said read gate line driving circuits;
 a write data transfer circuit whose components are coupled respectively to said data lines included in said sub-arrays and transfers data to be written into at least one of said nonvolatile memory cells when writing data into said nonvolatile memory cells;
 a data line selecting circuit whose components are coupled respectively to said data lines included in said sub-arrays and selects a data line when reading data from at least one of said nonvolatile memory cells; and
 an amplifier circuit which is commonly coupled to the components of said data line select circuit and amplifies a data signal appearing on the data line selected by said data line selecting circuit.

2. A semiconductor integrated circuit device comprising:
 an input/output circuit which inputs and outputs data and instructions;
 a bus which is coupled to said input/output circuit and serves as a path for transmitting the data and instructions;
 an operational circuit which is coupled to said bus, receives the data and instructions, and performs operational processing for the data; and
 a memory module which is coupled to said operational circuit and stores a result of operational processing performed by said operational circuit and instructions to be used by said operational circuit,
 said memory module including:
  a plurality of nonvolatile memory cells, each including a read select gate terminal, a write gate terminal, a data input/output terminal, and a power supply terminal;
  a plurality of sub-arrays, each including: read gate lines to which the write gate terminals of said nonvolatile memory cells are commonly coupled; read gate line driving circuits which drive said read gate lines; read select gate lines to which the read select gate terminals of said nonvolatile memory cells are commonly coupled; power supply lines to which the power supply terminals of said nonvolatile memory cells are commonly coupled; and data lines each of which is coupled to a subset of said data input/output terminals;
  a memory array including: said sub-arrays; write gate line driving circuits which are provided in common to the read select gate lines included in each of said sub-arrays; power supply line driving circuits which are commonly coupled to said power supply terminals included in each of said sub-arrays; and read gate line transfer circuits which are commonly coupled to said read gate line driving circuits;

a write data transfer circuit whose components are coupled respectively to said data lines included in said sub-arrays and transfers data to be written into at least one of said nonvolatile memory cells when writing data into said nonvolatile memory cells;

a data line selecting circuit whose components are coupled respectively to said data lines included in said sub-arrays and selects a data line when reading data from at least one of said nonvolatile memory cells; and an amplifier circuit which is commonly coupled to the components of said data line select circuit and amplifies a data signal appearing on the data line selected by said data line selecting circuit.

3. A semiconductor integrated circuit device comprising:

a plurality of nonvolatile memory cells, each including:
- a read select gate terminal;
- a write gate terminal;
- a data input/output terminal; and
- a power supply terminal;

a plurality of sub-arrays, each including:
- read gate lines to which the write gate terminals of said nonvolatile memory cells are commonly coupled;
- read gate line driving circuits which drive said read gate lines;
- read select gate lines to which the read select gate terminals of said nonvolatile memory cells are commonly coupled;
- power supply lines to which the power supply terminals of said nonvolatile memory cells are commonly coupled; and
- data lines each of which is coupled to said data input/output terminals;

a memory array including:
- the sub-arrays;
- write gate line driving circuits which are provided in common to the read select gate lines included in each of said sub-arrays;
- power supply line driving circuits which are commonly coupled to said power supply terminals included in each of said sub-arrays; and
- read gate line transfer circuits which are commonly coupled to said read gate line driving circuits;

a write data transfer circuit whose components are coupled respectively to said data lines included in said sub-arrays and transfers data to be written into at least one of said nonvolatile memory cells when writing data into said nonvolatile memory cells;

a data line selecting circuit whose components are coupled respectively to said data lines included in said sub-arrays and selects a data line when reading data from at least one of said nonvolatile memory cells; and an amplifier circuit which is commonly coupled to the components of said data line select circuit and amplifies a data signal appearing on the data line selected by said data line selecting circuit, wherein said nonvolatile memory cells comprise complementary storage cells in which one unit of data is stored in a pair of a negative cell for storing negative data and a positive cell for storing positive data.

4. A semiconductor integrated circuit device comprising:

an input/output circuit which inputs and outputs data and instructions;

a bus which is coupled to said input/output circuit and serves as a path for transmitting the data and instructions;

an operational circuit which is coupled to said bus, receives the data and instructions, and performs operational processing for the data; and a memory module which is coupled to said operational circuit and stores a result of operational processing performed by said operational circuit and instructions to be used by said operational circuit, said memory module including:
- a plurality of nonvolatile memory cells, each including a read select gate terminal, a write gate terminal, a data input/output terminal, and a power supply terminal;
- a plurality of sub-arrays, each including: read gate lines to which the write gate terminals of said nonvolatile memory cells are commonly coupled; read gate line driving circuits which drive said read gate lines; read select gate lines to which the read select gate terminals of said nonvolatile memory cells are commonly coupled; power supply lines to which the power supply terminals of said nonvolatile memory cells are commonly coupled; and data lines each of which is coupled to a subset of said data input/output terminals;
- a memory array including: said sub-arrays; write gate line driving circuits which are provided in common to the read select gate lines included in each of said sub-arrays; power supply line driving circuits which are commonly coupled to said power supply terminals included in each of said sub-arrays; and read gate line transfer circuits which are commonly coupled to said read gate line driving circuits;
- a write data transfer circuit whose components are coupled respectively to said data lines included in said sub-arrays and transfers data to be written into at least one of said nonvolatile memory cells when writing data into said nonvolatile memory cells;
- a data line selecting circuit whose components are coupled respectively to said data lines included in said sub-arrays and selects a data line when reading data from at least one of said nonvolatile memory cells; and
- an amplifier circuit which is commonly coupled to the components of said data line select circuit and amplifies a data signal appearing on the data line selected by said data line selecting circuit, wherein said nonvolatile memory cells comprise complementary storage cells in which one unit of data is stored in a pair of a negative cell for storing negative data and a positive cell for storing positive data.

5. The semiconductor integrated circuit device according to claim 1, further comprising circuits for selecting a gate line driving circuit to select one of said read gate line driving circuits.

6. The semiconductor integrated circuit device according to claim 1, wherein said memory cells are of a split gate type in which an insulating film is formed over a channel region between said data input/output terminal and said power supply terminal, the read select gate terminal is formed over said insulating film in a position nearer to said data input/output terminal, the write gate terminal is formed over said insulating film in a position nearer to said power supply terminal, and a charge storing layer is further formed between said insulating film and said write gate terminal.

7. The semiconductor integrated circuit device according to claim 1 wherein, in said memory array, the number of said write gate line driving circuits is smaller than the number of said read gate line driving circuits and the number of said power supply line driving circuits is smaller than the number of said read gate line driving circuits.

8. The semiconductor integrated circuit device according to claim 2, wherein said memory module receives via said bus an address signal for selecting at least one of or at least one pair of said nonvolatile memory cells, data to be written into the at least one of or the at least one pair of nonvolatile memory cells, and a write instruction, a write gate line driving circuit, one of said power supply line driving circuits, and a desired one of said read gate line driving circuits included in a desired one of said sub-arrays are selected according to said address signal, and, via a write data transfer circuit activated by said write instruction, the data is written into the at least one of or the at least one pair of nonvolatile memory cells coupled to the desired read gate line driving circuit included in the desired sub-array.

9. The semiconductor integrated circuit device according to claim 2, further comprising circuits for selecting a gate line driving circuit to select one of said read gate line driving circuits.

10. The semiconductor integrated circuit device according to claim 3, further comprising circuits for selecting a gate line driving circuit to select one of said read gate line driving circuits.

11. The semiconductor integrated circuit device according to claim 4, further comprising circuits for selecting a gate line driving circuit to select one of said read gate line driving circuits.

12. The semiconductor integrated circuit device according to claim 2, wherein said memory cells are of a split gate type in which an insulating film is formed over a channel region between said data input/output terminal and said power supply terminal, the read select gate terminal is formed over said insulating film in a position nearer to said data input/output terminal, the write gate terminal is formed over said insulating film in a position nearer to said power supply terminal, and a charge storing layer is further formed between said insulating film and said write gate terminal.

13. The semiconductor integrated circuit device according to claim 3, wherein said memory cells are of a split gate type in which an insulating film is formed over a channel region between said data input/output terminal and said power supply terminal, the read select gate terminal is formed over said insulating film in a position nearer to said data input/output terminal, the write gate terminal is formed over said insulating film in a position nearer to said power supply terminal, and a charge storing layer is further formed between said insulating film and said write gate terminal.

14. The semiconductor integrated circuit device according to claim 4, wherein said memory cells are of a split gate type in which an insulating film is formed over a channel region between said data input/output terminal and said power supply terminal, the read select gate terminal is formed over said insulating film in a position nearer to said data input/output terminal, the write gate terminal is formed over said insulating film in a position nearer to said power supply terminal, and a charge storing layer is further formed between said insulating film and said write gate terminal.

15. The semiconductor integrated circuit device according to claim 2, wherein, in said memory array, the number of said write gate line driving circuits is smaller than the number of said read gate line driving circuits and the number of said power supply line driving circuits is smaller than the number of said read gate line driving circuits.

16. The semiconductor integrated circuit device according to claim 3, wherein, in said memory array, the number of said write gate line driving circuits is smaller than the number of said read gate line driving circuits and the number of said power supply line driving circuits is smaller than the number of said read gate line driving circuits.

17. The semiconductor integrated circuit device according to claim 4, wherein, in said memory array, the number of said write gate line driving circuits is smaller than the number of said read gate line driving circuits and the number of said power supply line driving circuits is smaller than the number of said read gate line driving circuits.

18. The semiconductor integrated circuit device according to claim 4, wherein said memory module receives via said bus an address signal for selecting at least one of or at least one pair of said nonvolatile memory cells, data to be written into the at least one of or the at least one pair of nonvolatile memory cells, and a write instruction, a write gate line driving circuit, one of said power supply line driving circuits, and a desired one of said read gate line driving circuits included in a desired one of said sub-arrays are selected according to said address signal, and, via a write data transfer circuit activated by said write instruction, the data is written into the at least one of or the at least one pair of nonvolatile memory cells coupled to the desired read gate line driving circuit included in the desired sub-array.

* * * * *